(12) United States Patent
Tsuji et al.

(10) Patent No.: US 8,614,535 B2
(45) Date of Patent: Dec. 24, 2013

(54) SUBSTRATE, MANUFACTURING METHOD OF SUBSTRATE AND SAW DEVICE

(75) Inventors: Yutaka Tsuji, Osaka (JP); Shigeru Nakayama, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 48 days.

(21) Appl. No.: 13/275,710

(22) Filed: Oct. 18, 2011

(65) Prior Publication Data

US 2012/0091856 A1 Apr. 19, 2012

Related U.S. Application Data

(63) Continuation of application No. PCT/JP2011/070375, filed on Sep. 7, 2011.

(30) Foreign Application Priority Data

Sep. 7, 2010 (JP) .................................. 2010-199908
Jun. 30, 2011 (JP) .................................. 2011-145887

(51) Int. Cl.
*H03H 9/25* (2006.01)
*H01L 41/22* (2013.01)
*H04R 17/00* (2006.01)

(52) U.S. Cl.
USPC ...................... 310/313 R; 310/358; 29/25.35

(58) Field of Classification Search
USPC ...... 310/313 A, 313 B, 313 C, 313 D, 313 R, 310/358; 29/25.35
See application file for complete search history.

(56) References Cited

U.S. PATENT DOCUMENTS

| 5,352,638 | A | * | 10/1994 | Beall et al. | ...................... 501/10 |
| 5,744,401 | A | * | 4/1998 | Shirai et al. | ................... 438/693 |
| 5,831,512 | A | * | 11/1998 | Wienand et al. | ................ 338/25 |
| 6,107,639 | A | | 8/2000 | Yamazaki et al. | |
| 6,348,754 | B1 | | 2/2002 | Yoshida et al. | |
| 6,465,108 | B1 | * | 10/2002 | Kamitani et al. | ............. 428/448 |
| 6,515,299 | B1 | | 2/2003 | Yamazaki et al. | |

(Continued)

FOREIGN PATENT DOCUMENTS

| JP | 61-086466 A | 5/1986 |
| JP | H07-126061 A | 5/1995 |

(Continued)

OTHER PUBLICATIONS

International Search Report for PCT Application No. PCT/JP2011/066054, dated Dec. 7, 2010, pp. 1-2.

(Continued)

*Primary Examiner* — Thomas Dougherty
(74) *Attorney, Agent, or Firm* — Ditthavong Mori & Steiner, P.C.

(57) ABSTRACT

A substrate having appropriate strength and allowing firm bonding to a piezoelectric substrate and the like can be obtained at a lower cost. The substrate for an SAW device is formed of spinel, and PV value representing difference in level of one main surface of the substrate is at least 2 nm and at most 8 nm. Preferably, average roughness Ra of one main surface of the substrate is at least 0.01 nm and at most 0.5 nm. With such characteristics, the main surface of the substrate to be bonded to a piezoelectric substrate of the SAW device can be bonded satisfactorily to the piezoelectric material forming the piezoelectric substrate utilizing van der Waals interaction.

7 Claims, 10 Drawing Sheets

PLTV(LTV≤1.0um/☐5mm):69%
EXCEPT FOR 3mm FROM OUTER CIRCUMFERENCE:72%
BONDING AREA          :80%

(56) References Cited

U.S. PATENT DOCUMENTS

| | | |
|---|---|---|
| 6,699,107 B2 * | 3/2004 | Stoeckgen et al. ............ 451/72 |
| 7,691,287 B2 * | 4/2010 | Siddiqui et al. ............ 252/79.1 |
| 7,919,815 B1 * | 4/2011 | Tanikella et al. ............ 257/352 |
| 7,972,937 B2 * | 7/2011 | Akiyama et al. ............ 438/458 |
| 8,092,281 B2 * | 1/2012 | Masumura et al. ............ 451/285 |
| 2001/0011935 A1 * | 8/2001 | Lee et al. ............ 333/193 |
| 2002/0105249 A1 | 8/2002 | Yoshida et al. |
| 2003/0062522 A1 | 4/2003 | Yamazaki et al. |
| 2004/0132233 A1 | 7/2004 | Yamazaki et al. |
| 2004/0135650 A1 | 7/2004 | Miura et al. |
| 2004/0185666 A1 | 9/2004 | Fukuyama et al. |
| 2006/0172471 A1 | 8/2006 | Yamazaki et al. |
| 2008/0102603 A1 | 5/2008 | Kobayashi et al. |
| 2009/0072343 A1 | 3/2009 | Ohnuma et al. |
| 2010/0156241 A1 | 6/2010 | Suzuki et al. |
| 2010/0170696 A1 * | 7/2010 | Yano et al. ............ 174/126.2 |
| 2011/0041987 A1 | 2/2011 | Hori et al. |

FOREIGN PATENT DOCUMENTS

| | | |
|---|---|---|
| JP | 8148957 A | 6/1996 |
| JP | 11340769 A | 12/1999 |
| JP | H11-354445 A | 12/1999 |
| JP | 2000-278084 A | 10/2000 |
| JP | 2001-068964 A | 3/2001 |
| JP | 2001-111378 A | 4/2001 |
| JP | 2001-203561 A | 7/2001 |
| JP | 2001-332947 A | 11/2001 |
| JP | 2002290182 | 10/2002 |
| JP | 2004-186868 A | 7/2004 |
| JP | 2004343359 A | 12/2004 |
| JP | 2005104810 A | 4/2005 |
| JP | 2006-156770 A | 6/2006 |
| JP | 2008-301066 A | 12/2008 |
| JP | 2008301066 A | 12/2008 |
| JP | 2009-088497 A | 4/2009 |
| JP | 2009094661 A | 4/2009 |
| JP | 2009239983 A | 10/2009 |
| JP | 2010171955 A | 8/2010 |
| JP | 2011-071967 A | 4/2011 |

OTHER PUBLICATIONS

"SAW filter" Fujitsu Laboratories, Ltd., Japan, Jun. 2008 (searched Sep. 9, 2009), <URL:http://jp.fujitsu.com/group/labs/downloads/business/activities/activities-2/fujitsu-labs-netdev-001.pdf>; Partial English translation.

International Search Report for International Application No. PCT/JP2011/070375; International filing date: Sep. 7, 2011.

Written Opinion for International Application No. PCT/JP2011/070375; date of mailing: Oct. 25, 2011.

Restriction Office Action for U.S. Appl. No. 13/496,968 dated May 3, 2013.

Japanese Office Action in corresponding Patent Application No. 2009-217514, mailed on Jun. 4, 2013, 9 pgs.

* cited by examiner

PLTV(LTV≤1.0um／□5mm) : 69%
EXCEPT FOR 3mm FROM OUTER CIRCUMFERENCE : 72%
BONDING AREA : 80%

PLTV(LTV≤1.0um／□5mm) : 60%
EXCEPT FOR 3mm FROM OUTER CIRCUMFERENCE : 66%
BONDING AREA : 70%

PLTV(LTV≤1.0um/□5mm) : 77%
EXCEPT FOR 3mm FROM OUTER CIRCUMFERENCE : 92%
BONDING AREA : 98%

PLTV(LTV≤1.0um／□5mm) : 83%
EXCEPT FOR 3mm FROM OUTER CIRCUMFERENCE : 95%
BONDING AREA : 98%

SUBSTRATE, MANUFACTURING METHOD OF SUBSTRATE AND SAW DEVICE

CROSS REFERENCE TO RELATED APPLICATIONS

The present application is a continuation of International Application No. PCT/JP2011/070375 filed Sep. 7, 2011, which claims priorities to Japanese Patent Application No. 2010-199908 filed Sep. 7, 2010 and No. 2011-145887 filed Jun. 30, 2011, the entire contents of each of these applications being incorporated herein by reference in their entirety.

BACKGROUND OF THE INVENTION

1. Field of the Invention

The present invention relates to a substrate for an SAW device, a method of manufacturing the substrate, and to the SAW device.

2. Description of the Background Art

In a mobile telephone, an electronic component referred to as an SAW filter for transmitting/receiving electric signals of only the desired frequencies is incorporated. The SAW (Surface Acoustic Wave) filter means a surface wave filter. In an SAW device such as the SAW filter, a piezoelectric substrate formed of a material having piezoelectric effect is used. Generally, an SAW device is used bonded on a holding substrate having superior radiation performance, to radiate heat generated by the piezoelectric substrate at the time of use.

By way of example, Japanese Patent Laying-Open No. 2008-301066 (Patent Document 1) discloses a composite substrate including a holding substrate having low coefficient of thermal expansion and a piezoelectric substrate of an SAW device bonded to each other.

A method of bonding the piezoelectric substrate and the holding substrate is disclosed, for example, in Japanese Patent Laying-Open No. 2004-343359 (Patent Document 2). Specifically, a piezoelectric substrate and a holding substrate are washed to remove impurities on bonding surfaces of the two substrates and, thereafter, the bonding surface or surfaces are irradiated with plasma, neutralized beam or ion beam of oxygen or inert gas, whereby remaining impurities are removed and the surface layer of the bonding surface or surfaces is activated. With the activated bonding surface or surfaces, the piezoelectric substrate and the holding substrate are bonded.

A piezoelectric substrate deforms as it receives stress from input electric signals. Therefore, the holding substrate mounting the piezoelectric substrate must have high strength. For this reason, some of conventionally used holding substrates for mounting piezoelectric substrate for the SAW device are formed of sapphire, as described, for example, in FUJITSU SAW filter (Non-Patent Document 1).

As the holding substrates disclosed in each of the documents cited above, mainly, sapphire single crystal substrates are used. Single crystal of sapphire, however, is typically very expensive. This leads to high-cost of production of substrates for mounting piezoelectric substrates for the SAW device.

Though sapphire has sufficient strength as a substrate for mounting a piezoelectric substrate for the SAW device, it has very high hardness and, therefore, formed substrate is sometimes prone to damage such as chipping. Further, due to the high hardness, cutting work of sapphire to a substrate of a desired shape is difficult. Consequently, speed of cutting cannot be increased, further leading to higher cost of sapphire substrates. Further, since sapphire has cleavage characteristic particular to single crystal, it is highly possible that the sapphire holding substrate split due to stress applied by the deformation of piezoelectric substrate.

In Patent Document 1, for example, the holding substrate and the piezoelectric substrate are bonded by an adhesive. For highly accurate bonding of piezoelectric substrate to the holding substrate, however, bonding utilizing van der Waals interaction between the two substrates is preferred.

When substrates are bonded using van der Waals interaction, it is preferred that bonding surfaces have superior flatness. Therefore, it is preferred that the bonding surface of holding substrate to the piezoelectric substrate is subjected to three types of polishing including rough polishing, normal polishing and polishing with diamond abrasive grains. However, even after the bonding surface of holding substrate is polished with diamond abrasive grains, when it is to be joined to the bonding surface of piezoelectric substrate, many voids tend to generate between the two bonding surfaces, resulting in failure of bonding.

According to Patent Document 2, the bonding surface is irradiated with ion beams or plasma, so that the bonding surface is activated and an amorphous layer is formed, and then, the bonding surfaces are joined. Patent Document 2, however, is silent about the polishing process of bonding surface. Therefore, even if the bonding method disclosed in this document is used, there is still a possibility of bonding failure, resulting from roughness or difference in level of the bonding surface.

SUMMARY OF THE INVENTION

The present invention was made in view of the above-described problems. Its object is to provide a substrate having appropriate strength and allowing firm bonding to a piezoelectric substrate by van der Waals interaction at a lower cost, a method of manufacturing the substrate and an SAW device using the substrate.

The present invention provides a substrate for an SAW device formed of spinel, wherein one main surface of the substrate has a value PV representing difference in level of at least 2 nm and at most 8 nm. Here, the main surface refers to a major surface of largest area among the surfaces.

As a result of intensive study, the inventors have found that spinel, which is mainly used in the field of optical devices, may possibly be used in place of sapphire, as the holding substrate for mounting an SAW device such as the SAW filter described above. Physical properties such as strength of spinel are close to those of sapphire, including the strength. It has been found that a holding substrate for SAW devices formed of spinel can practically be used, similar to the holding substrate for SAW devices formed of sapphire. By way of example, an SAW device holding substrate formed of spinel exhibits practically well acceptable strength (Young's modulus), though not as high as that of an SAW device holding substrate formed of sapphire. Further, spinel has coefficient of thermal conductivity practically sufficient to radiate heat generated by the piezoelectric substrate forming the SAW device.

Conventionally, however, it has been technical common sense to use a single crystal body such as sapphire for the substrate for holding SAW devices. Among those skilled in the art, spinel, which is a polycrystalline body, has been inconceivable as a candidate for substrate material. Going against the common sense, the inventors continued study and came to found that spinel could be used for the SAW device holding substrate. If an SAW device holding substrate is formed using spinel (spinel holding substrate) in place of sapphire, production cost of the substrate can be reduced.

Further, as a result of intensive study, the inventors have found that a PV (peak-to-valley) value representing difference in level of the bonding surface of spinel holding substrate to be bonded to the piezoelectric substrate forming an SAW filter or the like has an influence on the state of bonding at the bonding surface. Here, the value PV represents difference in level (unevenness) between the highest peak and the lowest valley of a cross-sectional curve of the surface.

When bonding to a piezoelectric substrate is to be attained utilizing van der Waals interaction, satisfactory bonding can be attained between the bonding surface and the piezoelectric substrate, if the bonding surface of spinel holding substrate is flat. As a result of intensive study, the inventors have found that satisfactory bonding to the piezoelectric substrate can be attained if the PV value of the bonding surface of the substrate formed of spinel is at least 2 nm and at most 8 nm. Thus, the main surface of the substrate to be bonded to the piezoelectric substrate can be bonded in a satisfactory manner utilizing van der Waals interaction, to the piezoelectric material forming the piezoelectric substrate.

In the substrate mentioned above, preferably, one main surface of the substrate has a value Ra of average roughness of at least 0.01 nm and at most 0.5 nm.

Since sapphire crystal is single crystal, a substrate formed of sapphire can easily be processed to realize a good value Ra of average roughness of the main surface. On the other hand, spinel has polycrystalline structure and, hence, it generally has high surface roughness at the boundary of adjacent crystal grains. The inventors have found, however, that even the substrate using polycrystalline spinel can attain superior flatness with the value Ra of average roughness of the main surface being 0.01 nm to 0.5 nm, by controlling processing method. Therefore, the main surface of the substrate to be bonded to the piezoelectric substrate can satisfactorily be bonded to the piezoelectric material forming the piezoelectric substrate, utilizing van der Waals interaction.

From the foregoing, the SAW device using the substrate formed of spinel is inexpensive as compared with the conventional SAW device using sapphire, while the substrate is comparable to the substrate formed of sapphire and has sufficient strength to be practically usable and, therefore, stable electric signal transmission characteristic can be realized.

In the substrate described above, on the main surface, when a plurality of square areas of 5 mm×5 mm are set and areas other than those within 3 mm from outer circumference of the main surface are regarded as a plurality of evaluation object areas, PLTV (Percent LTV) representing ratio of the evaluation object areas having LTV (Local Thickness Variation) of at most 1.0 µm with respect to all the evaluation object areas may be at least 90%.

From a different viewpoint, the present invention provides a substrate for an SAW device formed of spinel, having one main surface; wherein on the main surface, when a plurality of square areas of 5 mm×5 mm are set and areas other than those within 3 mm from outer circumference of the main surface are regarded as a plurality of evaluation object areas, PLTV representing ratio of the evaluation object areas having LTV of at most 1.0 µm with respect to all the evaluation object areas is at least 90%. If PLTV is at least 90%, even the substrate formed of spinel as polycrystalline body can directly be bonded to the main surface of the piezoelectric substrate forming the SAW device, without using any adhesive material on the main surface of the substrate. Therefore, using the substrate, an SAW device having superior characteristics comparable to that obtained using sapphire substrate can be obtained at a lower cost than conventionally possible.

The present invention provides a method of manufacturing a substrate for an SAW device formed of spinel, including the steps of: preparing the substrate; and conducting chemical mechanical polishing on one main surface of the substrate. Here, as the method of preparing the substrate includes the steps of preparing raw material powder, molding, sintering and cutting shown, for example, in FIG. 6.

The PV value of 2 nm to 8 nm and Ra value of 0.01 nm to 0.5 nm of the main surface of the substrate in accordance with the present invention can be realized by performing CMP (Chemical Mechanical Polishing) on one of the main surfaces of the substrate. Specifically, PV value of the one main surface of the substrate after the step of conducting chemical mechanical polishing may be at least 2 nm and at most 8 nm, and Ra value of the one main surface of the substrate may be at least 0.01 nm and at most 0.5 nm. Therefore, if chemical mechanical polishing is conducted on the holding substrate formed of spinel, the substrate attains satisfactory bonding to the piezoelectric substrate utilizing van der Waals interaction. Specifically, the SAW device using the substrate formed of spinel is inexpensive as compared with the conventional SAW device using sapphire, while the substrate is comparable to the substrate formed of sapphire and has sufficient strength and heat radiation characteristic to be practically usable and, therefore, stable electric signal transmission characteristic can be realized.

In the method described above, at the step of conducting chemical mechanical polishing, the substrate may be polished placed between a polishing pad arranged on a platen and a polishing head arranged opposite to the polishing pad. Further, a soft layer having lower hardness than the polishing head may be arranged between the polishing head and the substrate. Here, flatness of the substrate can be improved. As a result, a substrate allowing easy bonding of a piezoelectric substrate to its main surface is provided.

The SAW device in accordance with the present invention includes the substrate described above and a piezoelectric substrate arranged on one main surface of the substrate. As described above, by using a substrate formed of spinel, an SAW device having characteristics comparable to the SAW device using a sapphire substrate can be provided at a lower cost. The substrate and the piezoelectric substrate may be bonded. As to the method of bonding, the substrate and the piezoelectric substrate may directly be bonded using, for example, surface activation method. Depending on the characteristics required of the SAW device, the substrate and the piezoelectric substrate may be bonded using adhesive material.

By the present invention, a spinel holding substrate having practically acceptable strength and attaining satisfactory bonding to a piezoelectric substrate such as an SAW filter using van der Waals interaction can be provided at a low cost.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
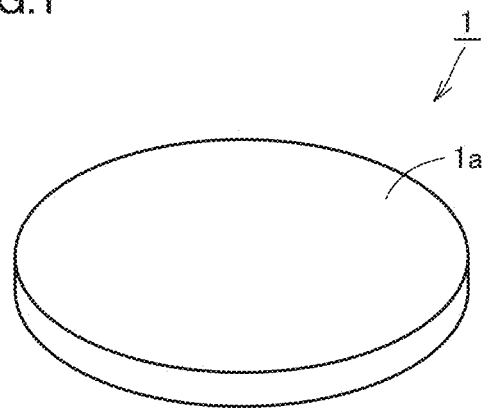
FIG. 1 is a perspective view showing an appearance of the substrate in accordance with an embodiment of the invention.

In the following, embodiments of the present invention will be described with reference to the figures. In the figures, the same or corresponding portions are denoted by the same reference characters, and description thereof will not be repeated.

Embodiment 1

As shown in FIG. 1, a substrate in accordance with the present embodiment is a wafer formed of spinel, of which main surface $1a$ has a diameter of 4 inches. By way of example, $MgO \cdot nAl_2O_3$ ($1 \leq n \leq 3$) is used as the spinel for forming substrate 1.

Substrate 1 may be used as a component for heat radiation in an electronic device, or it may be used as a filter for a high-frequency transmitter. Alternatively, it may be used as a substrate for electronic device used as an auto component. Besides, substrate 1 may be used as a holding substrate for mounting (bonding) a piezoelectric substrate 10 forming an SAW filter 2 as an SAW device, as shown in FIG. 2.

Figure 2:
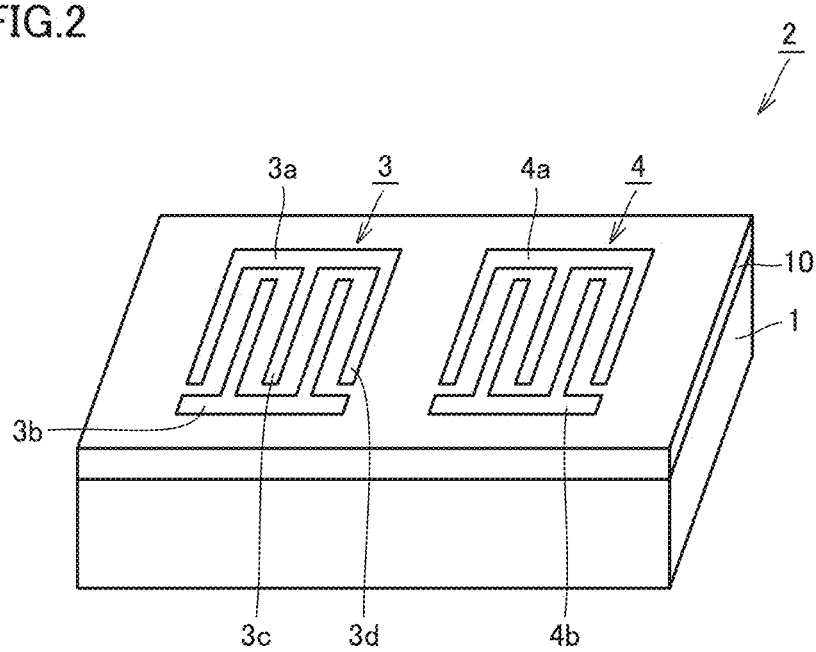
FIG. 2 is a perspective view showing an appearance of an SAW filter using the substrate of FIG. 1.

Substrate 1 shown in FIG. 2 is a part of substrate 1 shown in FIG. 1. On a main surface $1a$ of substrate 1, a piezoelectric substrate 10 is bonded. On a main surface of piezoelectric substrate 10 opposite to the main surface facing substrate 1 (on the upper main surface in FIG. 2), comb-shaped electrodes 3 and 4 of metal thin film are formed.

Assume, for example, that electrode 3 of FIG. 2 is an electrode for inputting an acoustic wave signal, and electrode 4 is an electrode for outputting the acoustic wave signal. Electrode 3 consists of a set of first electrode $3a$ and second electrode $3b$, and electrode 4 consists of a set of first electrode $4a$ and second electrode $4b$. Between the first and second electrodes $3a$ and $3b$, an AC voltage, for example, is applied, and between the first and second electrodes $4a$ and $4b$, an AC voltage, for example, is applied. To a current caused by the AC voltage applied between the first and second electrodes $3a$ and $3b$, an acoustic wave signal is input. Then, crystal grains (atoms) forming piezoelectric substrate 10 having electrodes 3 and 4 formed thereon receive stress and, because of piezoelectric effect, the grains move closer to or away from each other. As a result, the main surface of piezoelectric substrate 10 vibrates like ripples.

As shown in FIG. 2, however, the first electrodes $3a$ and $4a$ and second electrodes $3b$ and $4b$ each have comb-shape. Therefore, of acoustic wave signals input to electrode 3, for example, only the acoustic wave signals having a wavelength corresponding to the distance between comb components $3c$ and $3d$ resonate and propagate to the outside from the output side electrode 4. Specifically, acoustic signals having wavelength different from the wavelength mentioned above are not propagated to the outside from the output side electrode 4, and cut off in SAW filter 2. Because of such a principle, SAW filter 2 functions to output only the acoustic wave signals having a desired wavelength to the outside and hence, functions to cut off acoustic wave signals having wavelength other than the desired wavelength (that is, noise) and thereby to remove noise from the output signals.

Particularly, when substrate 1 is used as a base substrate for the SAW filter shown in FIG. 2, one of the main surfaces of substrate 1, specifically, main surface $1a$ to be bonded to piezoelectric substrate 10, should preferably be joined to crystal grains (molecules) forming piezoelectric body 10 by van der Waals interaction. More specifically, molecules of the material forming piezoelectric substrate 10 should preferably be joined to molecules of spinel forming substrate 10 by van der Waals interaction. It is difficult to bond piezoelectric substrate 10 to main surface $1a$ of the substrate formed of spinel by using, for example, an adhesive. Therefore, in order to have piezoelectric substrate 10 mounted stably on main surface $1a$ of substrate 1 formed of spinel, it is preferred that piezoelectric substrate 10 be firmly bonded on main surface $1a$ using van der Waals interaction.

Figure 3:
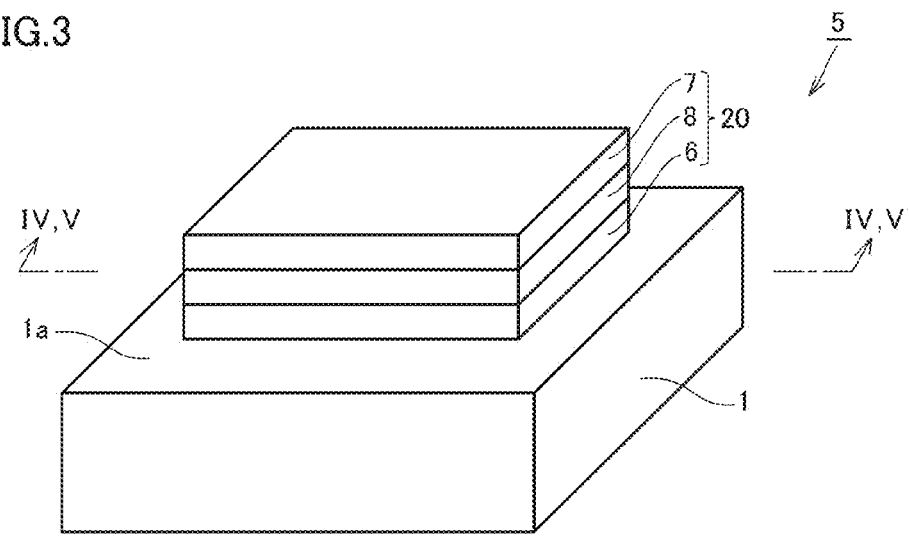
FIG. 3 is a perspective view showing an appearance of a BAW filter using the substrate of FIG. 1.

Further, substrate 1 formed of spinel in accordance with the present embodiment may be used as a holding substrate for mounting (bonding) a BAW (Bulk Acoustic Wave) filter 5 having a resonator 20 (consisting of lower and upper electrodes 6 and 7 and a piezoelectric film 8 positioned therebetween) mounted (bonded) on main surface $1a$ of substrate 1 as shown, for example, in FIG. 3.

Lower and upper electrodes 6 and 7 may preferably be formed of generally known metal material used for forming electrodes, such as molybdenum. Further, piezoelectric film 8 may preferably be formed of ceramic material such as AlN (aluminum nitride) or ZnO (zinc oxide).

In BAW filter 5, lower electrode 6 of resonator 20 and main surface $1a$ of substrate 1 are bonded by van der Waals interaction, as in the case of piezoelectric substrate 10 of SAW filter 2 and main surface 1*a* of substrate 1.

Figure 4:
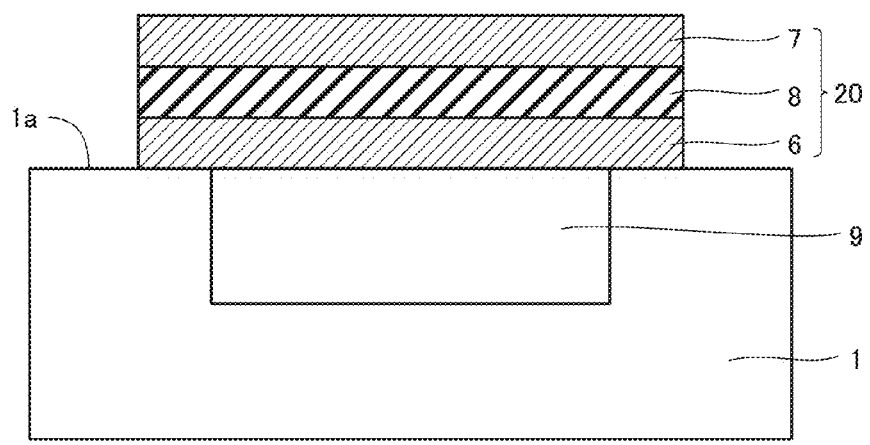
FIG. 4 is a schematic cross-sectional view showing an exemplary cross-section of a portion along the line IV,V-IV,V of FIG. 3.
Figure 5:
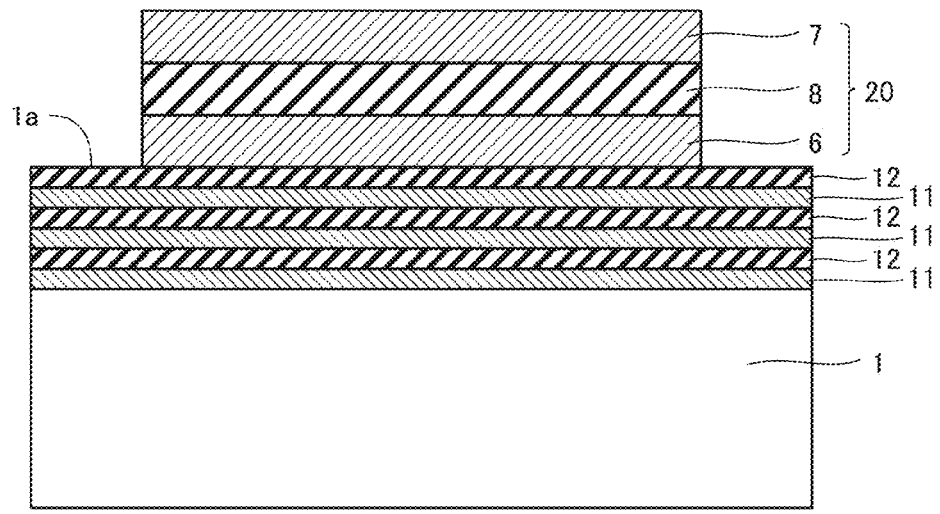
FIG. 5 is a schematic cross-sectional view showing another exemplary cross-section, different from FIG. 4, of a portion along the line IV,V-IV,V of FIG. 3.

By way of example, BAW filter 5 may be an FBAR (Film Bulk Acoustic Resonator) type device having such a structure as shown in FIG. 4, or it may be an SMR (Solid Mounted Resonator) type device having such a structure as shown in FIG. 5. For instance, a BAW filter 5 of FBAR type shown in FIG. 4 is a BAW filter having a hollow cavity 9 formed to a prescribed depth from main surface 1*a*, with part of resonator 20 facing hollow cavity 9. BAW filter 5 of SMR type shown in FIG. 5 is a BAW filter having a plurality of low impedance layers 11 and high impedance layers 12 stacked alternately on substrate 1.

SAW filter 2 utilizes surface wave (surface acoustic wave), whereas BAW filter 5 utilizes bulk elastic wave, and it operates using resonant vibration of piezoelectric film 8 itself. For example, in FBAR type BAW filter 5 shown in FIG. 4, piezoelectric film 8 vibrates freely utilizing hollow cavity 9 below resonator 20. In SMR type BAW filter 5 shown in FIG. 5, elastic wave proceeding from the upper to lower portion of FIG. 5, for example, is reflected by low impedance film 11 and high impedance film 12 as an acoustic multilayer provided below resonator 20, and the wave reaches and vibrates piezoelectric film 8.

When piezoelectric film 8 vibrates, only the acoustic wave signals having a specific wavelength resonate and are propagated to the outside from an output side electrode (for example, upper electrode 7), as in the case where piezoelectric substrate 10 vibrates in SAW filter 2. Thus, noise in the output signals can be removed.

In order to have piezoelectric substrate 10 mounted stably on main surface 1*a* of substrate 1 formed of spinel, main surface 1*a* should preferably have superior flatness. Specifically, it is preferred that the PV value representing difference in level of main surface 1*a* is at least 2 nm and at most 8 nm. Here, PV means PV particularly at a portion of main surface 1*a* which is directly bonded to the bonding surface of piezoelectric substrate 10.

With the value PV of 2 nm to 8 nm, main surface 1*a* comes to have superior flatness. Therefore, substrate 1 as the holding substrate and piezoelectric substrate 10 can be firmly and stably bonded utilizing van der Waals interaction, with main surface 1*a* serving as a bonding surface. In order to have the value PV smaller than 2 nm, processing of main surface 1*a* to have extremely high flatness becomes necessary, which involves much increased cost. Therefore, at least 2 nm represents the PV value that can be attained at a reasonable cost and reasonable time of processing. From the viewpoint of reasonable processing cost and securing bonding strength of piezoelectric substrate 10, more preferable PV value is at least 4 nm and at most 6 nm. Here, PV means PV particularly at a portion of main surface 1*a* which is directly bonded to the bonding surface of piezoelectric substrate 10.

Further, preferably, main surface 1*a* of substrate 1 has arithmetic average roughness Ra of at least 0.01 nm and at most 0.5 nm. With the value Ra of 0.5 nm or smaller, main surface 1*a* comes to have superior flatness. Therefore, substrate 1 and piezoelectric substrate 10 can be firmly and stably bonded utilizing van der Waals interaction, with main surface 1*a* serving as a bonding surface.

In order to have the value Ra smaller than 0.01 nm, processing of main surface 1*a* to have extremely high flatness becomes necessary, which involves much increased cost. Therefore, at least 0.01 nm represents the Ra value that can be attained at a reasonable cost and reasonable time of processing. From the viewpoint of reasonable processing cost and securing bonding strength of piezoelectric substrate 10, more preferable Ra value mentioned above is at least 0.01 nm to at most 0.5 nm.

It is noted, however, that the above-described flatness of main surface 1*a* is not always required, depending on the intended use of the substrate. For example, it is not required when substrate is used as a substrate for a device other than SAW filter 2 or BAW filter 5, such as a filter for high-frequency transmitter as described above.

Substrate 1 supports piezoelectric substrate 10 and resonator 20 that vibrate. Therefore, considerable stress is applied to substrate 1. Further, when piezoelectric substrate 10 operates, piezoelectric substrate 10 generates heat, and the heat propagates to substrate 1. Specifically, at this time, thermal stress generates in substrate 1. Therefore, substrate 1 should preferably have considerably high strength. When substrate 1 is used as a substrate for devices other than SAW filter 2 described above, substrate 1 may be placed under severe conditions and, therefore, substrate 1 should preferably have considerably high strength as when substrate 1 is used for SAW filter 2.

Generally, a structure having higher Young's modulus has higher strength, and a structure having lower Young's modulus has lower strength. Therefore, to ensure strength high enough to withstand use under the conditions described above, substrate 1 should preferably have Young's modulus of at least 150 GPa and at most 350 GPa. With Young's modulus of 150 GPa or higher, substrate 1 has sufficient strength to withstand use under the above-described conditions. Further, generally, a structure having higher Young's modulus has higher hardness, and a structure having lower Young's modulus has lower hardness. Therefore, if Young's modulus of substrate 1 exceeds 350 GPa, hardness of substrate 1 comes to be excessively high, resulting in high possibility of chipping. Further, if Young's modulus of substrate 1 exceeds 350 GPa, hardness of substrate 1 comes to be excessively high, and processing becomes difficult. Therefore, from the viewpoint of ensuring appropriate strength and preventing defects such as chipping, it is preferred that substrate 1 have Young's modulus in the range described above. Particularly, at least 180 GPa and at most 300 GPa is the most preferable range.

Figure 6:
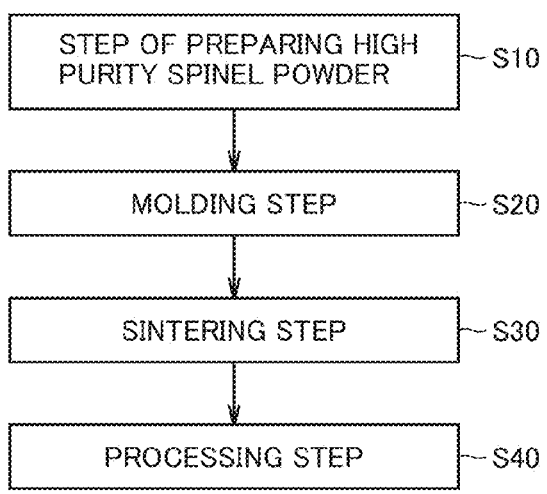
FIG. 6 is a flowchart representing the method of manufacturing the substrate in accordance with the present embodiment.

Next, a method of manufacturing substrate 1 will be described. As shown in the flowchart of FIG. 6, first, the step of preparing high purity spinel powder (S10) is executed. Specifically, this is the step of preparing spinel powder as the material for forming substrate 1 of spinel. More specifically, spinel powder represented by the composition formula of $MgO \cdot nAl_2O_3$ ($1 \leq n \leq 3$), having average grain diameter of at least 0.1 μm and at most 0.3 μm and purity of 99.5% or higher is preferably prepared.

In order to prepare the spinel powder having the composition described above, it is preferred to mix MgO (magnesium oxide) powder and $Al_2O_3$ (alumina) powder to a mixture ratio (molar ratio) of $1 \leq Al_2O_3/MgO \leq 3$.

Here, the grain diameter of powder grains means the value of diameter of powder cross-section at a portion where accumulated volume as the sum of powder volumes added from the side of smaller grain size to the side of larger grain size reaches 50%, when the grain size is measured using particle size distribution measurement by laser diffraction/scattering method. The particle size distribution measurement specifically refers to a method of measuring diameter of powder particles or grains, by analyzing scattering intensity distribution of scattered light of laser beam directed to powder particles. The average value of grain diameter of a plurality of powder grains included in the prepared spinel powder is the above-mentioned average grain diameter.

Thereafter, the molding step (S20) shown in FIG. 6 is executed. Specifically, molding by press molding or CIP (Cold Isostatic Pressing) is executed. More specifically, the $MgO.nAl_2O_3$ powder prepared at step (S10) is first subjected to preforming by press molding, followed by CIP, to obtain a molded body. Here, only one of press molding and CIP may be executed, or both may be executed. For example, press molding may be executed and thereafter CIP may be executed.

For press molding, use of pressure of at least 10 MPa and at most 300 MPa, and particularly, pressure of 20 MPa is preferred. In CIP, use of pressure, for example, of at least 160 MPa and at most 250 MPa, and particularly, at least 180 MPa and at most 230 MPa is preferred.

Next, the sintering step (S30) shown in FIG. 6 is executed. As the sintering step, preferably, vacuum sintering method in which a molded body is sintered placed in vacuum atmosphere, or HIP (Hot Isostatic Pressing) in which a molded body is pressurized and sintered in an argon gas atmosphere is used. In place of the above method, hot pressing may be used. Here, only one of vacuum sintering and HIP may be executed, or a plurality of methods may be executed, for example, HIP may be executed following vacuum sintering. Further, after HIP is formed, thermal processing may be executed again.

In vacuum sintering, specifically, the molded body is placed in a vacuum atmosphere, heated to at least 1600° C. and at most 1800° C., and kept for at least one hour and at most three hours. In this manner, a sintered body having density of 95% or higher can be formed. In HIP, the sintered body (or the molded body not subjected to sintering by hot press) is placed in an argon atmosphere, heated to at least 1600° C. and at most 1900° C. while applying pressure of at least 150 MPa and at most 250 MPa, and kept for at least one hour and at most three hours, whereby sintering is done. By the sintering at the pressure and temperature as mentioned above, the density of formed sintered body comes to satisfy the conditions of strength (Young's modulus) required of the eventually formed substrate. The reason for this is that composition change to the spinel sintered body is caused by the pressure, and voids in the sintered body are removed by diffusion mechanism.

The sintered body sintered in the above-described manner is subjected to processing step (S40) as shown in FIG. 6. Specifically, the sintered body is first cut (cutting process) by dicing, to a desired thickness (of substrate 1). Thus, a base of substrate 1 having a desired thickness is completed. Here, the desired thickness should preferably be determined in consideration of the thickness of finally formed substrate 1 and the margin for polishing of main surface 1a of substrate 1 in the subsequent steps.

Next, the main surface of the base of substrate 1 is polished. Specifically, this is the step of polishing main surface 1a of substrate 1 to be finally formed to have the desired value Ra of average roughness. Particularly, if substrate 1 is used as the substrate for SAW filter, it is preferred to have main surface 1a polished to attain the desired values of PV and Ra, as described above.

Polishing of main surface 1a of substrate 1 to attain superior flatness preferably includes four stages of polishing, that is, rough polishing, normal polishing, polishing with diamond abrasive grains and CMP, executed successively. Specifically, in the rough polishing as the first stage (S41) and in the normal polishing as the second stage (S42), main surface 1a is mirror-polished using a polisher. Here, in rough polishing and normal polishing, the count of abrasive grains used for polishing differs. Specifically, in rough polishing, GC grinder of which abrasive grains have counts #800 to #2000 is preferably used, and in normal polishing, diamond grinder of which abrasive grains have grain diameter of 3 to 5 μm is preferably used.

Next, polishing as a finishing process of the third stage (S43) is preferably executed using diamond abrasive grains. Diamond abrasive grains have very high hardness and very small average grain diameter of about 0.5 μm to 1.0 μm. Therefore, diamond abrasive grains are suitably used as abrasive grains for highly precise mirror finish. Polishing process is done for 10 minutes, for example, using the abrasive grains. In the chemical mechanical polishing as the fourth stage (S44), chemical polisher and polishing pad are used, and ups and downs on the wafer surface is ground down and made flat by combined action of chemical function and mechanical polishing. In this manner, the difference in level at the crystal grain boundary of spinel as the polycrystalline body can be made flat, and the value PV of main surface 1a after CMP can be made smaller. Further, as the main surface 1a is made flat by chemical mechanical polishing (S44), the value Ra in addition to PV can also be made smaller.

In this manner, highly flat main surface 1a having difference in level PV of 2 nm to 8 nm and average roughness Ra of 0.01 nm to 0.5 nm described above can be realized. Therefore, substrate 1 particularly for SAW filter can satisfactorily be bonded to the main surface of piezoelectric substrate 10 by van der Waals interaction.

When the substrate formed of spinel is used, for example, for a filter of a high-frequency transmitter, such a high flatness as required for the spinel substrate for a SAW filter as described above is unnecessary. In this case, for the three stages of polishing described above, it is preferable to use abrasive grains used for forming substrate 1 for the SAW filter in the first and second stages. In the finishing process of the third stage, however, CMP (Chemical Mechanical Processing) is typically executed.

Embodiment 2

Figure 7:
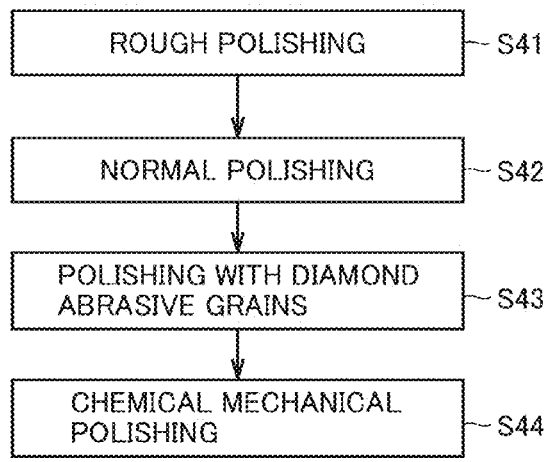
FIG. 7 is a flowchart representing the method of polishing the substrate in accordance with the present embodiment.

A method of manufacturing substrate 1 in accordance with Embodiment 2 of the present invention will be described. Though the method of manufacturing substrate 1 is basically the same as the method including the step of preparing high purity spinel powder (S10) to the processing step (S40) shown in FIG. 6, the contents of polishing at the processing step (S40) is partially different. Specifically, on the base of substrate 1 obtained by cutting the sintered body, the step of polishing such as shown in FIG. 7 is executed. The number of stages for polishing is four, as in Embodiment 1 above. Specifically, it is preferred that rough polishing (S41), normal polishing (S42), polishing with diamond abrasive grains (S43) (also referred to as finish polishing) and chemical mechanical polishing (CMP) (S44) are successively executed.

Referring to FIG. 7, in the rough polishing as the first stage (S41), main surfaces (front and back surfaces) of the substrate are polished using a polisher (for example, a double-side polisher). As the abrasive agent, GC grinder of count #800 to #2000 is used. The amount of polishing is, for example, at least 50 μm and at most 200 μm.

Next, the normal polishing (S42) is executed. At this step (S42), each of the main surfaces (front and back surfaces) of the substrate is polished using a single-side polisher. As the abrasive agent, diamond abrasive grains having abrasive grain diameter of at least 3 µm and at most 5 µm can be used. The amount of polishing is, for example, at least 10 µm and at most 30 µm.

Next, the step of polishing with diamond abrasive grains (S43) is executed. At this step (S43), each of the main surfaces (front and back surfaces) of the substrate is polished using, for example, a single-side polisher. As the abrasive agent, diamond abrasive grains having abrasive grain diameter of at least 0.5 µm and at most 1 µm can be used. The amount of polishing is, for example, at least 3 µm and at most 10 µm.

Next, the chemical mechanical polishing step (S44) (CMP step) is executed. At this step (S44), one of the main surfaces of the substrate is polished using, for example, a CMP apparatus. As the slurry used for polishing, one having mechanical polishing property enhanced (chemical polishing property reduced) than common slurry for sapphire is used. Polishing time is preferably at least 10 minutes and at most 45 minutes and, more preferably, at least 15 minutes and at most 40 minutes.

Figure 8:
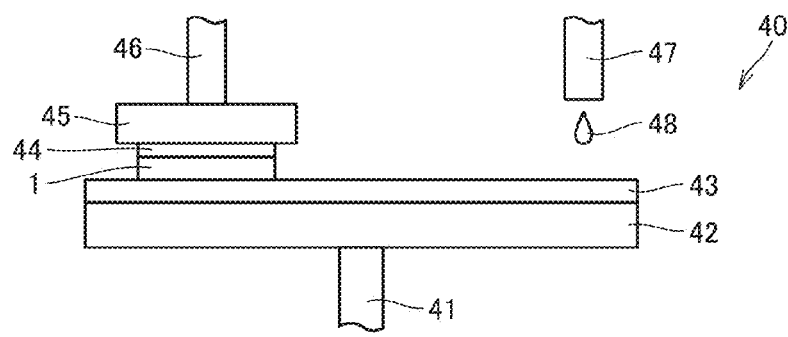
FIG. 8 is a schematic illustration showing an exemplary step of chemical mechanical polishing.

At the CMP step (S44) described above, a CMP apparatus 40 such as shown in FIG. 8 is used. Referring to FIG. 8, the CMP apparatus includes a platen 42 of which planar shape is circular, a polishing pad 43 arranged on platen 42, and a polishing head 45 arranged opposite to polishing pad 43, and substrate 1 is polished, positioned between the pad and the head. Between polishing head 45 and substrate 1, a soft layer 44 having lower hardness than polishing head 45 is arranged. Substrate 1 is pressed to polishing pad 43 by polishing head 45 with soft layer 44 interposed. Platen 42 is supported by a pillar 41 connected at the central portion. Polishing head 45 is supported by a rotary pillar 46 connected to the central portion of polishing head 45. Further, slurry 48 is supplied from a slurry supplying unit 47 to polishing pad 43. Using the CMP apparatus having such a structure, flatness of substrate 1 can be improved. Specifically, assume that a plurality of square areas of 5 mm×5 mm are set on main surface 1a of substrate 1. Of these areas, areas other than those within 3 mm from outer circumference of main surface 1a are regarded as a plurality of evaluation object areas. Substrate 1 having PLTV of 90% or higher can be obtained, where PLTV represents the ratio of evaluation object areas having LTV of 1.0 µm or smaller with respect to all evaluation object areas. A piezoelectric substrate can easily be bonded to main surface 1a of such a substrate 1.

Next, a method of manufacturing SAW filter 2 as an SAW device having the structure of FIG. 2, manufactured using the substrate 1 obtained in the above-described manner will be described with reference to FIG. 9.

Figure 9:
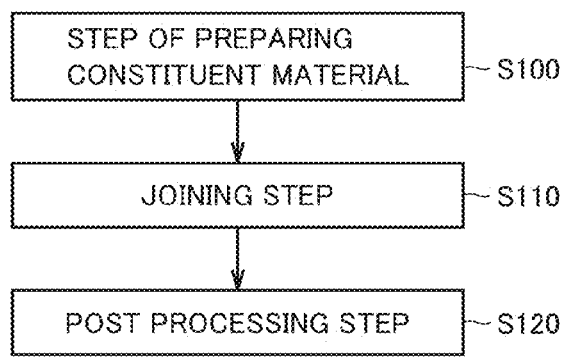
FIG. 9 is a flowchart representing the method of manufacturing a light emitting device shown in FIG. 2.

First, as shown in FIG. 9, the step of preparing constituent material (S100) is executed. At this constituent material preparing step (S100), spinel substrate 1 in accordance with the present invention is prepared by the manufacturing method described with reference to Embodiment 2. Further, a device structure having electrodes 3 and 4 formed on piezoelectric substrate 10 forming SAW filter 2 is prepared. Electrodes 3 and 4 have such planar shapes as shown in FIG. 2. As to the method of forming electrodes 3 and 4, conventionally well-known method such as sputtering may be used. Aluminum or an aluminum alloy may be used as the material for electrodes 3 and 4.

Next, joining step (S110) is executed. Specifically, back surface (the surface opposite to the surface having electrodes 3 and 4 formed thereon) of piezoelectric substrate 10, which is the surface to be bonded to substrate 1 in the device structure, is irradiated with an ion beam, so that the back surface is activated. In place of the ion beam, plasma or the like may be brought into contact with the back surface.

Thereafter, main surface 1a of substrate 1 and the back surface of piezoelectric substrate 10 of the device structure are brought into contact with each other. At this time, stress may be applied such that main surface 1a of substrate 1 is pressed to the back surface of piezoelectric substrate 10. Here, since main surface 1a of substrate 1 in accordance with the present invention has superior flatness, such bonding (normal temperature bonding) can reliably be attained.

Though the back surface of piezoelectric substrate is directly bonded to main surface 1a of substrate 1 above, the back surface of piezoelectric substrate 10 may be bonded to the main surface 1a of substrate 1 using an adhesive layer inserted therebetween. Arbitrary adhesive material such as spin on glass (SOG), polyimide or silicone may be used as the material for the adhesive layer.

Next, the post processing step (S120) is executed. Specifically, this step includes, if a support member has been connected to the device structure for supporting the device structure at the joining step (S110), the step of removing the support member from the SAW filter. Further, the steps of placing the resulting SAW filter in a prescribed package and providing wires for connection of the electrodes to the outside may be executed.

Example 1

The values PV and Ra of substrate 1 having main surface 1a polished in accordance with the manufacturing method of the embodiment and a substrate formed of spinel not subjected to such polishing were compared, and state of bonding to piezoelectric substrate was inspected. First, in accordance with manufacturing steps (S10) to (S30) shown in FIG. 6, twenty sintered bodies as the original form of spinel substrates were formed. Thereafter, at the processing step of step (S40), main surfaces of the sintered bodies were polished. Specifically, among the twenty sintered bodies, some were subjected only to the steps (S41) to (S43) of FIG. 7, and remaining sintered bodies were subjected to all of the steps (S41) to (S44) of FIG. 7.

Specifically, at the slicing step performed at the start of step (S40), the sintered body was cut such that the main surface 1a come to have a substantially circular shape of 100 mm in diameter. Thereafter, at step (S41), main surface 1a was polished for 20 minutes using GC abrasive grinder with abrasive grains of count #800. Thereafter, at step (S42), main surface 1a was polished for 20 minutes using a single-side polisher with diamond grinder of which abrasive grains had grain diameter of 3 to 5 µm.

Thereafter, at step (S43), main surface 1a was polished for 30 minutes using a single-side polisher with diamond grinder of which abrasive grains had grain diameter of 0.5 to 1.0 µm. Finally, at step (S44), CMP process was done for 30 to 60 minutes using a single-side polisher.

For substrate 1 formed through the above-described steps, the values VP and Ra of main surface 1a after the step (S43) and before the step (S44) and main surface 1a after the step (S44) were measured, respectively. Here, the values PV and Ra were measured using an AFM (Atomic Force Microscope). The scope of measurement was an area of 0.176 mm×0.132 mm on main surface 1a.

Further, to main surface 1a after the step (S43) and before the step (S44) of CMP (in Table 1 below, "before CMP") and to main surface 1a after the step (S44) (in Table 1 below, "after CMP"), a 4-inch LT wafer as a piezoelectric wafer was bonded, utilizing van der Waals interaction. After bonding, ratio of voids generated between the boding surfaces of the two was measured. Results of measurements are as shown in Table 1 below.

TABLE 1

|  | Before CMP | After CMP |
| --- | --- | --- |
| PV | 9.364 nm | 4.190 nm |
| Ra | 0.775 nm | 0.326 nm |
| Ratio of voids | 100% | 10% |

From Table 1, it can be seen that by performing CMP after polishing main surface 1a with diamond abrasive grains, the values PV and Ra of main surface 1a can be made smaller. Further, by such a process, the state of bonding between main surface 1a and the piezoelectric substrate can be improved, and generation of voids that degrades the state of bonding between the two bonding surfaces can be reduced.

Example 2

Substrate 1 having the main surface 1a polished in accordance with the manufacturing method of the present invention, a substrate formed of spinel not subjected to such polishing, and a substrate formed of sapphire single crystal were compared to inspect difference in level at grain boundary, flatness, TTV (Total Thickness Variation) and warpage.

Here, the difference in level at grain boundary means the difference in level particularly at the grain boundary of spinel crystals. The flatness particularly represents unevenness of main surface 1a and, more specifically, it represents the largest level difference on main surface 1a. TTV represents difference between the maximum and minimum values of height of main surface 1a measured in the thickness direction of substrate 1, with the main surface (back surface) opposite to the main surface 1a as the object of measurement of substrate 1 being used as a reference surface. Further, warpage represents the degree of curving of the main surface of substrate 1 as a whole.

Here, four substrates formed of spinel having the diameter of 4 inches, and two substrates formed of sapphire having the diameter of 4 inches were prepared, and each of the substrates were subjected to polishing of steps (S41) to (S44) as in Example 1.

For the main surface of substrates formed of sapphire (in Table 2 below, "sapphire"), various parameters as mentioned above of the main surface after the step (S44) of CMP were measured. For the substrates formed of spinel, various parameters as mentioned above of main surface 1a after the step (S43) and before the step (S44) of CMP (in Table 2, "spinel before CMP") and of main surface 1a after the step S44 (in Table 2 below, "spinel after CMP") were measured.

Here, the difference in level at grain boundary was measured by using AFM:VN-8000 manufactured by KEYENCE. The scope of measurement of level difference was 200 µm×200 µm.

The flatness, TTV and warpage were measured using FM200XRA-Wafer (Corning Tropel). Results of measurements are as shown in Table 2 below.

TABLE 2

| Level difference at grain boundary | Sapphire | Spinel before CMP Average about 6 nm, max 18 nm | Spinel after CMP Average about 3 nm, max 18 nm |
| --- | --- | --- | --- |
| Flatness | 300 nm | 450 nm | 330 nm |
| TTV | 1.0 µm | 1.2 µm | 1.2 µm |
| Warpage | 13 µm | 101 µm | 99 µm |

It can be seen from Table 2 that the spinel substrate not subjected to CMP and the spinel substrate subjected to CMP have comparable values of level difference at grain boundary, flatness, TTV and warpage. Therefore, it can be understood that comparable quality can be ensured if the main surface of spinel substrate is subjected to CMP or not subjected to CMP. Further, from the comparison between sapphire substrates and spinel substrates, it can be seen that the substrates have comparable values, particularly of flatness and TTV, except for the warpage.

Example 3

In order to confirm the effects of the present invention, the following experiment was conducted.

(Samples)

Four substrates formed of spinel, having the diameter of 4 inches and thickness of 0.25 mm were prepared.

As to the polishing step, the four stages of polishing described with reference to Embodiment 2 of the present invention described above were conducted. Process conditions of the rough polishing step (S41), normal polishing step (S42) and the step of polishing with diamond abrasive grains (S43) were common to the four substrates.

Of the four substrates, samples No. 1 and No. 2 were subjected to the CMP process with the soft layer added to the platen side of the CMP apparatus at the CMP step (S44). Of the four substrates, for samples No. 3 and No. 4, the soft layer was added to the polishing head side of the CMP apparatus at the CMP step.

(Contents of Experiment)

Surface accuracy of the substrates (holding substrates) prepared in the above-described manner was evaluated. Further, a wafer formed of a material other than spinel was actually bonded at room temperature to the main surface of holding substrate formed of spinel, and the state of bonding was visually evaluated. To facilitate evaluation of bonding state, the wafer (wafer to be bonded) was formed of a material that transmits light. Specifically, as the light transmitting material of the wafer to be bonded, $LiTaO_3$ was used here.

Evaluation of Surface Accuracy:

PLTV of the main surface of holding substrate was measured using a flatness measuring/analyzing apparatus. As the PLTV, the value obtained in the following manner was used. Specifically, on the main surface of holding substrate, a plurality of square areas of 5 mm×5 mm were set, and of these areas, areas other than those within 3 mm from outer circumference of main surface 1a are regarded as a plurality of evaluation object areas (sites). The ratio of evaluation object areas having LTV (Local Thickness Variation) of 1.0 µm or smaller with respect to all evaluation object areas was used as the PLTV. The sites can be provided parallel to the orientation flat. LTV can be represented as a difference between the maximum and minimum height in one site, of the substrate from the back surface as a reference.

In data analysis, if the central point of the square area of 5 mm×5 mm (site) was positioned within 3 mm from the outer circumference of the main surface, the site was removed from the object of evaluation, and if the central point is inner than 3 mm from the outer circumference of the main surface, the site was regarded as the object of evaluation.

Further, warpage of each substrate was measured using the flatness measuring/analyzing apparatus. Here, only the central point of back surface of the holding plate was fixed, and the height from the reference surface was measured. The maximum height was used as the warpage value.

Evaluation of Bonding State:

After the evaluation of surface accuracy, a light transmitting wafer for bonding having the diameter of 4 inches and thickness of 0.5 mm was bonded at room temperature to the main surface of each substrate. Specifically, the surface of wafer for bonding was irradiated with argon ions, so that the surface of wafer for bonding was activated. Thereafter, the main surface of holding substrate formed of spinel was pressed to the activated surface of wafer for bonding and thus bonded at room temperature. After bonding, portions of successful bonding state and portions where bonding failed of the bonded holding substrate were visually confirmed. Specifically, where bonding failed, a gap is formed between the surfaces of wafer for bonding and the holding substrate formed of spinel and, hence, that portion becomes whiter than at portions of satisfactory bonding state. Thus, the portions of changed color were visually confirmed.

(Results)

Figure 10:
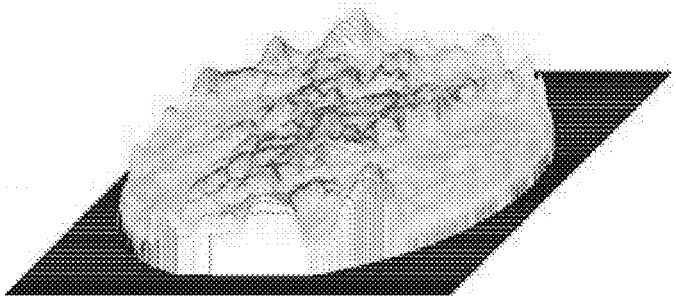
FIG. 10 is a schematic illustration showing, in three-dimensional manner, state of ups and downs on the main surface of substrate sample No. 1.
Figure 11:
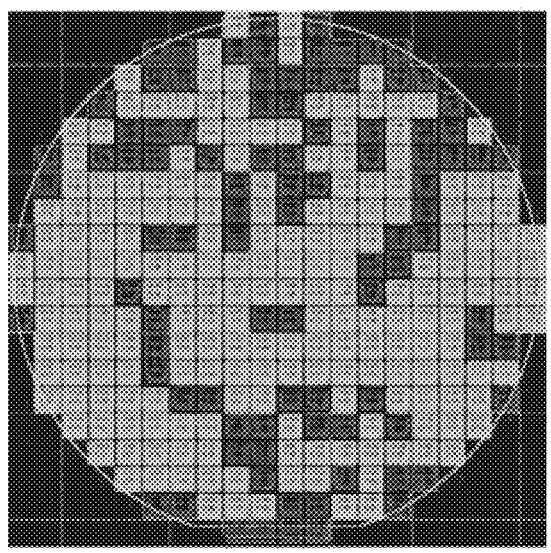
FIG. 11 is a schematic illustration showing PLTV on the main surface of substrate sample No. 1.
Figure 12:
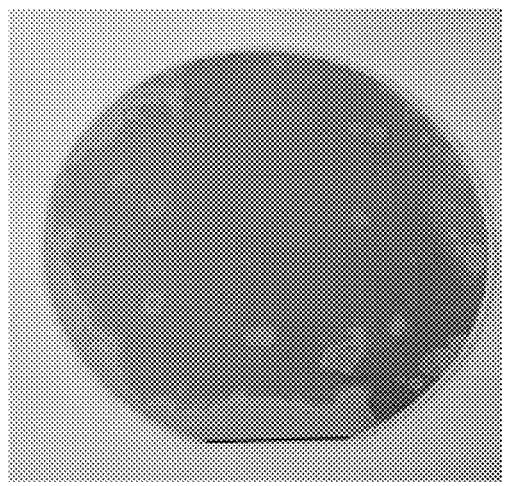
FIG. 12 is a photograph showing appearance of the bonding substrate, using the substrate sample No. 1.
Figure 13:
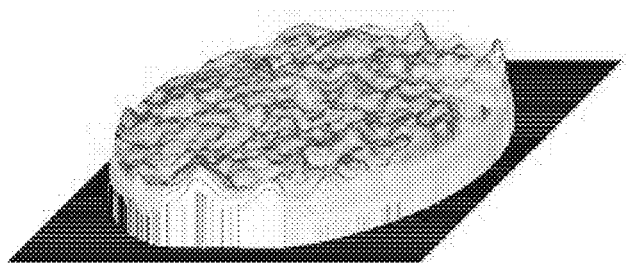
FIG. 13 is a schematic illustration showing, in three-dimensional manner, state of ups and downs on the main surface of substrate sample No. 2.
Figure 14:
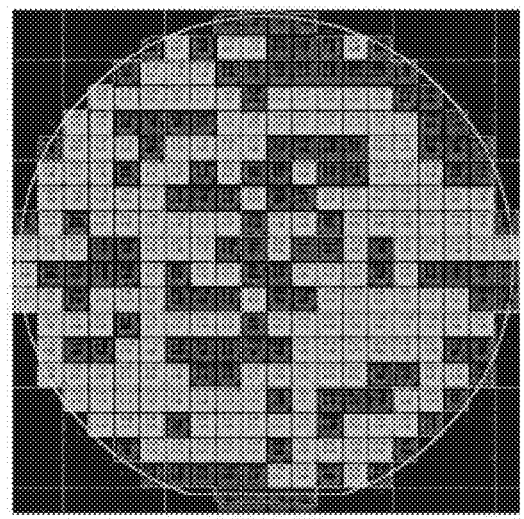
FIG. 14 is a schematic illustration showing PLTV on the main surface of substrate sample No. 2.
Figure 15:
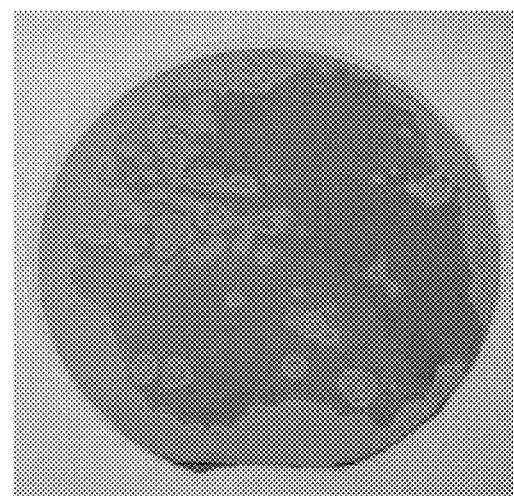
FIG. 15 is a photograph showing appearance of the bonding substrate, using the substrate sample No. 2.
Figure 16:
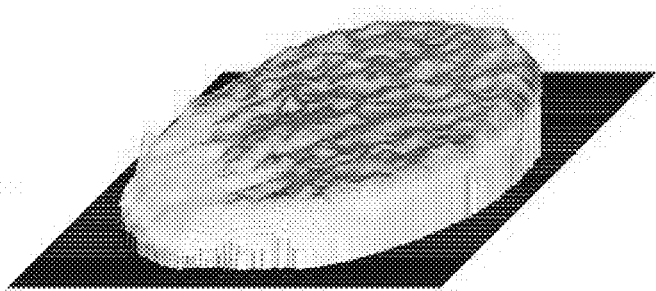
FIG. 16 is a schematic illustration showing, in three-dimensional manner, state of ups and downs on the main surface of substrate sample No. 3.
Figure 17:
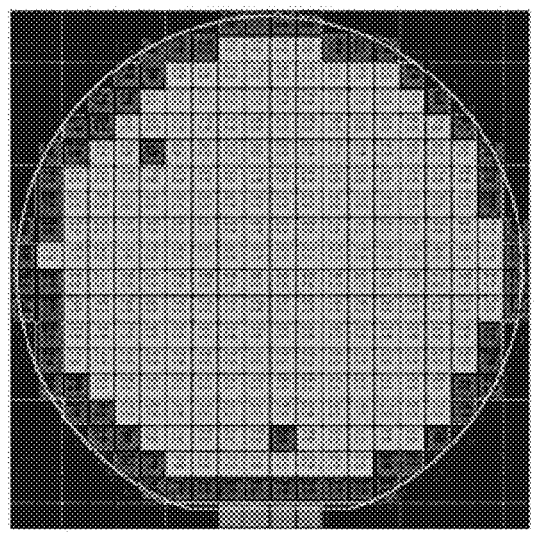
FIG. 17 is a schematic illustration showing PLTV on the main surface of substrate sample No. 3.
Figure 18:
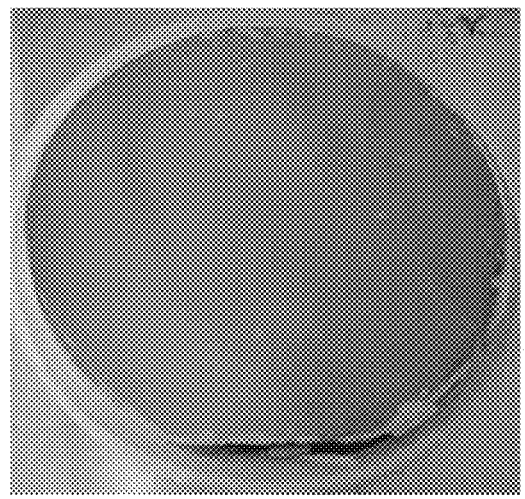
FIG. 18 is a photograph showing appearance of the bonding substrate, using the substrate sample No. 3.
Figure 19:
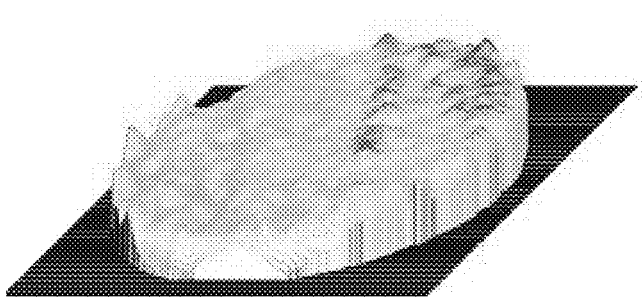
FIG. 19 is a schematic illustration showing, in three-dimensional manner, state of ups and downs on the main surface of substrate sample No. 4.
Figure 20:
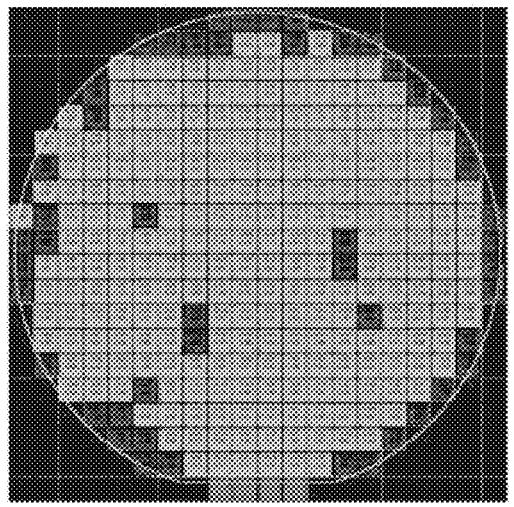
FIG. 20 is a schematic illustration showing PLTV on the main surface of substrate sample No. 4.
Figure 21:
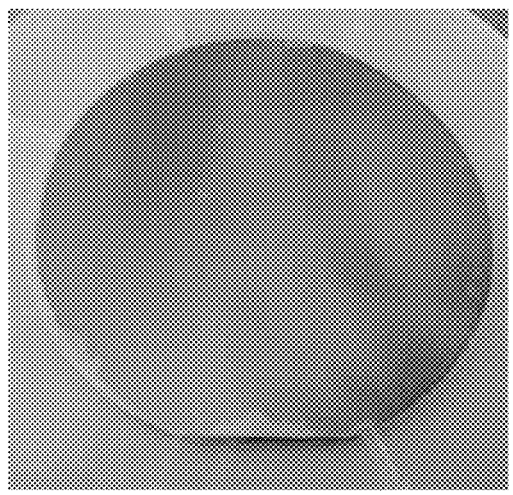
FIG. 21 is a photograph showing appearance of the bonding substrate, using the substrate sample No. 4.

Results of measurements are shown in FIGS. 10 to 21. FIGS. 10 to 12 represent results of sample No. 1; FIGS. 13 to 15 represent results of sample No. 2; FIGS. 16 to 18 represent results of sample No. 3; and FIGS. 19 to 21 represent results of sample No. 4. FIGS. 10, 13, 16 and 19 are schematic illustrations showing, in three-dimensional manner, state of ups and downs on the main surface of substrate samples, respectively. FIGS. 11, 14, 17 and 20 show, among the plurality of square areas of 5 mm by 5 mm set on the main surface of the holding substrate, areas having LTV of 1.0 µm or lower in white, and areas having LTV exceeding 1.0 µm in black. FIGS. 12, 15, 18 and 21 show appearance of the substrate after bonding (bonded substrate).

Referring to FIGS. 10 to 12, of sample No. 1, PLTV except for the scope within 3 mm from the outer circumference of holding substrate was 72%, and warpage was 78 µm. As can be seen from FIG. 12 showing the state of bonding of wafer for bonding, the ratio of portions showing satisfactory state of bonding on the main surface of holding substrate was 80%.

Referring to FIGS. 13 to 15, of sample No. 2, PLTV except for the scope within 3 mm from the outer circumference of holding substrate was 66%, and warpage was 66 µm. As can be seen from FIG. 15 showing the state of bonding of wafer for bonding, the ratio of portions showing satisfactory state of bonding on the main surface of holding substrate was 70%.

Referring to FIGS. 16 to 18, of sample No. 3, PLTV except for the scope within 3 mm from the outer circumference of holding substrate was 92%, and warpage was 91 µm. As can be seen from FIG. 18 showing the state of bonding of wafer for bonding, the ratio of portions showing satisfactory state of bonding on the main surface of holding substrate was 98%.

Referring to FIGS. 19 to 21, of sample No. 4, PLTV except for the scope within 3 mm from the outer circumference of holding substrate was 95%, and warpage was 96 µm. As can be seen from FIG. 12 showing the state of bonding of wafer for bonding, the ratio of portions showing satisfactory state of bonding on the main surface of holding substrate was 98%.

Example 4

After the wafer for bonding was bonded to each of the above-described samples No. 1 to No. 4, the bonded substrates were diced, and bonding strength between the holding substrate formed of spinel and the wafer for bonding of the diced samples was examined.

(Samples)

Bonded substrates using the holding substrates of sample Nos. 1 to 4 formed in Example 1 above were prepared.

(Contents of Experiment)

The four prepared substrates were diced to provide a plurality of square shaped samples of 10 mm×10 mm. Then, ten samples of 10 mm×10 mm square were taken out from respective bonded substrates, and opposite surfaces of each sample were adhered to jigs and pulled to peel the holding substrate formed of spinel from the bonding wafer in the direction of 180° using a tensile tester, and tension strength was measured.

(Results)

The samples prepared from the holding substrates of sample No. 1 and No. 2 had average tension strength of 5 PMa. In contrast, the samples prepared from the holding substrates of sample No. 3 and No. 4 had average tension strength of 12 PMa. Therefore, it can be understood that if PLTV is 90% or higher, sufficiently high bonding strength (tension strength) is attained between the bonded substrates.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A substrate for an SAW device formed of spinel, wherein one main surface of said substrate has a value PV representing difference in level of at least 2 nm and at most 8 nm, wherein on said main surface, when a plurality of square areas of 5 mm × 5 mm are set and areas other than those within 3 mm from outer circumference of the main surface are regarded as a plurality of evaluation object areas, PLTV representing ratio of said evaluation object areas having LTV of at most 1.0 µm with respect to all said evaluation object areas is at least 90%.

2. The substrate according to claim 1, wherein one main surface of said substrate has a value Ra of average roughness of at least 0.01 nm and at most 0.5 nm.

3. An SAW device, comprising: the substrate according to claim 1; and a piezoelectric substrate arranged on one main surface of said substrate.

4. The SAW device according to claim 3, wherein said substrate and said piezoelectric substrate are bonded.

5. A substrate for an SAW device formed of spinel, having one main surface; wherein on said main surface, when a plurality of square areas of 5 mm × 5 mm are set and areas other than those within 3 mm from outer circumference of the main surface are regarded as a plurality of evaluation object areas, PLTV representing ratio of said evaluation object areas having LTV of at most 1.0 µm with respect to all said evaluation object areas is at least 90%.

6. An SAW device, comprising: the substrate according to claim 5; and a piezoelectric substrate arranged on one main surface of said substrate.

7. The SAW device according to claim 6, wherein said substrate and said piezoelectric substrate are bonded.

* * * * *